(12) United States Patent
Eisenhauer (10) Patent No.: US 6,699,301 B1
(45) Date of Patent: Mar. 2, 2004

(54) VENTILATOR

(75) Inventor: Hartmut Eisenhauer, Michelfeld (DE)

(73) Assignee: Stego-Holding GmbH, Schwabisch Hall (DE)

( * ) Notice: Subject to any disclaimer, the term of this patent is extended or adjusted under 35 U.S.C. 154(b) by 0 days.

(21) Appl. No.: 09/980,363

(22) PCT Filed: Jun. 2, 2000

(86) PCT No.: PCT/EP00/05057
§ 371 (c)(1),
(2), (4) Date: Feb. 28, 2002

(87) PCT Pub. No.: WO00/74459
PCT Pub. Date: Dec. 7, 2000

(30) Foreign Application Priority Data

Jun. 2, 1999 (DE) .......................... 199 25 439

(51) Int. Cl.[7] .............................. B01D 46/10
(52) U.S. Cl. .............................. 55/471; 55/472; 55/473; 55/492; 55/496; 55/497; 55/501; 55/DIG. 31; 55/DIG. 35
(58) Field of Search ............... 55/492, 497, 496, 55/501, 502, 511, 513, 516, 507, 509, 471, 472, 473, DIG. 31, DIG. 35; 181/284

(56) References Cited

U.S. PATENT DOCUMENTS

| | | | | |
|---|---|---|---|---|
| 5,240,487 A | * | 8/1993 | Kung | ................. 55/DIG. 35 |
| 5,597,392 A | * | 1/1997 | Hawkins et al. | ........ 55/DIG. 35 |
| 5,690,719 A | * | 11/1997 | Hodge | ................. 55/DIG. 35 |
| 5,707,411 A | * | 1/1998 | Rodaway et al. | ...... 55/DIG. 35 |
| 5,776,218 A | * | 7/1998 | Enns | ................. 55/DIG. 35 |
| 5,944,860 A | * | 8/1999 | Mack et al. | ........... 55/DIG. 35 |
| 6,126,708 A | * | 10/2000 | Mack et al. | ........... 55/DIG. 35 |

FOREIGN PATENT DOCUMENTS

| | | |
|---|---|---|
| DE | 93 06 032.7 | 12/1993 |
| DE | 195 25 850 C1 | 8/1996 |
| DE | 197 00 065 A1 | 5/1998 |

* cited by examiner

Primary Examiner—Blaine Copenheaver
Assistant Examiner—Minh-Chan T. Pham
(74) Attorney, Agent, or Firm—Merchant & Gould, P.C.

(57) ABSTRACT

The invention relates to a filter ventilator that can be installed within an aperture in a wall, in particular the wall of a switch cabinet, circuit box, device housing or the like. The filter ventilator includes at least one ventilator motor (16, 50) with fan blades and a filter (14), which is positioned ahead of the ventilator motor (16) in the airstream. In accordance with the invention a build-in frame (10) with attachment means (24) and an insertion frame (12) are provided. The build-in frame (10) can be permanently fixed within the aperture. The insertion frame (12) is removably inserted into the build-in frame (10), the ventilator motor (16) is releasably connected to the insertion frame (12) and the filter (14) is removably set into the insertion frame (12). In addition, an exhaust filter is provided, which is constructed like the filter ventilator but includes no ventilator motor (16).

24 Claims, 8 Drawing Sheets

VENTILATOR

The invention relates to a filter ventilator according to the precharacterizing clause of claim 1. The invention further relates to an exhaust filter according to the precharacterizing clause of claim 24.

Filter ventilators are required for the ventilation of switch cabinets, circuit boxes, device housings and the like. In particular electronic components integrated into switch cabinets generate large amounts of heat. Overheating can damage electronic elements, in particular semiconductor elements, or even destroy them. Ventilation of such switch cabinets counteracts excessive heat development. For this purpose, a ventilator is used to suck in the outside air and blow it into the interior of the cabinet. By way of one or more exhaust openings in the walls of the switch cabinet, the warmed air is blown out again. Hence there is a heat exchange between the air in the cabinet and the external air.

In the external air dust particles are always present. Often it is necessary for the switch cabinets to be set up in particularly dusty surroundings. Therefore it is advantageous to insert a filter ahead of the ventilator, so that the air that is being sucked in first passes through the filter and then the ventilator, before entering the cabinet. Having been warmed in the interior of the cabinet, the air is expelled to the exterior by way of the exhaust openings. The filter ventilators are customarily installed in stamped-out or nibbled-out openings in the cabinet wall.

Especially in dusty surroundings, the filters must be exchanged relatively frequently. Although the ventilator motors have a relatively long working life, in the case of long-term operation motor failure can also be expected to occur, so that the ventilator motors must also be exchanged.

Replacing the motor of the known filter ventilators is a relatively elaborate process. The motor is in the interior of the switch cabinet and is accessible only from there, whereas the means by which the motor is mounted are accessible only from outside. Therefore two people are needed to exchange a motor: one to manipulate the attachment means from outside, while the other holds the motor from inside, so that a great deal of effort is required. Furthermore, for reasons of safety it can be necessary for the electronic components to be turned off before a person reaches into the interior of the switch cabinet.

The initial installation of the known filter ventilators in the aperture in a wall is also relatively complicated. Again, at least two people are needed so that the installation can be carried out from two sides of the wall.

Furthermore, it is desirable for the switch cabinets to be sealed to prevent electromagnetic waves from radiating inward or outward. Shielding to ensure electromagnetic compatibility is difficult when a cabinet is simultaneously being ventilated. EMC-shielded ventilators are known in which grids are disposed between the filter and the ventilator motor. These grids are connected by strips of sheet metal to contact strips mounted on the back side of attachment flanges for the ventilators. With such shielding there are regions where the EMC seal is incomplete, so that it often does not satisfy the requirements. For optimal EMC shielding it is necessary for the entire periphery of an aperture in the wall of the switch cabinet to be electrically connected to the grid. To achieve this, in the known apparatus the cabinet wall must have an exposed surface around the aperture. Because the wall of a switch cabinet is generally lacquered, the lacquer must be removed before a ventilator is installed. In the case of the known ventilators this applies to the inner surface of the cabinet wall. Both the initial installation of such ventilators and the replacement of the ventilator motors or filters are thus very elaborate processes.

It is the objective of the invention to make available a filter ventilator that can be installed and removed in a simple manner, and in which the ventilator motor and the filter can be exchanged from one side of the wall, by a single person.

A further objective of the invention is to make available a corresponding exhaust filter.

For the filter ventilator this aim is achieved by the object with the characteristics given in claim 1. In the case of the exhaust filter, it is achieved by the object with the characteristics given in claim 24.

In accordance with the invention the filter ventilator is provided with a build-in frame and an insertion frame, such that the build-in frame comprises attachment means and can be permanently installed in the aperture, the insertion frame is removably inserted into the build-in frame, the ventilator motor is releasably connected to the insertion frame and the filter is removably inserted into the insertion frame.

It is thus provided that when the filter ventilator is first installed in the aperture of a wall, the build-in frame is permanently fixed within that aperture by attachment means. The insertion frame is set into the build-in frame so that it can be removed and needs to be taken out of the build-in frame only when access to the reverse side of the ventilator motor is required, or the motor must be replaced. The filter is merely removably set into the insertion frame in front of the motor, from the viewpoint of the operator, so that when the filter must be exchanged, the insertion frame can remain in place within the build-in frame. Therefore the initial installation of the filter ventilator in the aperture of a wall, the exchanging of the filter and the replacement of the ventilator motor can be undertaken by a single person and from a single side of the wall, in particular from the outside of the wall. A commercially available ventilator motor can be used, which is obtainable on site.

It is preferably provided that between the ventilator motor and the filter a grid is disposed, which extends within the insertion frame parallel to the plane of the frame. This grid ensures the spatial separation of the filter from the ventilator motor, in particular with respect to the fan blades. Penetration of filter particles into the ventilator motor is thereby prevented or at least restricted.

Preferably it is provided that the insertion frame is constructed in one piece with the grid. This contributes to the stability of the insertion frame. An insertion frame of this kind can be manufactured simply and economically.

It can further be provided that the insertion frame comprises first spacer elements, so that there is a predetermined distance between the grid and the filter. By this means an empty space is left between the grid and the filter, which acts as a pressure-equilibration or turbulence space. Hence the air flows uniformly through the filter, which results in a low pressure loss and an optimal utilization of the filter.

Similarly, it can be provided that the insertion frame comprises second spacer elements, so that there is a predetermined distance between the grid and the ventilator motor. This cavity also causes the pressure loss of the airstream to be relatively low.

In an especially preferred embodiment of the invention it is provided that the build-in frame, the insertion frame and the grid are made of metal, or at least their surfaces have a metal coating. These measures allow the filter ventilator to be tightly EMC-sealed. For many switch cabinets or the like it is required, or at least desirable, that no electromagnetic radiation passes inward or outward through their walls. In this respect the aperture constitutes a weak point, which is eliminated in particular by the metallic or metallized grid. The switch cabinet can therefore be ventilated and simultaneously achieve the required EMC impenetrability.

It is further provided that the insertion frame be releasably attached within the build-in frame by means of a clamping device. To release a clamping device, in general no tools or only simple, standard tools are needed, so that the insertion frame can rapidly and simply be removed from the build-in frame and replaced therein.

In particular it is provided that the clamping device is composed of a large number of flexible tongues. Preferably these tongues are disposed at the periphery of the insertion frame and extend perpendicular to the plane of the frame. The tongues act as springs, ensuring that the insertion frame is securely held within the build-in frame. Furthermore, the tongues form a continuous electrical contact between insertion frame and build-in frame, extending around the entire periphery. This makes a substantial contribution to the EMC seal.

It is further provided that the build-in frame comprises a flange on which the attachment means can be mounted. A flange enables the build-in frame to be installed especially simply within the aperture in the wall, and guarantees a secure seating. Furthermore, the flange makes a considerable contribution to the EMC seal.

Preferably it is provided that the attachment means are adhesive strips. Adhesive strips enable a particularly simple installation of the build-in frame within the aperture in the wall and provide a secure seating. In addition, they do not require any holes to be drilled in the wall. Furthermore, adhesive strips constitute a water-tight connection, at least one through which splashed water cannot penetrate.

It is further provided that the build-in frame comprises a contact band with teeth, which extends along the periphery of the build-in frame in such a way that the teeth can be brought into engagement with the edge of the aperture. As a result, an electrical connection is ensured between the wall and the build-in frame over the entire periphery of the build-in frame and the entire edge of the aperture. The contact band thus contributes substantially to the EMC seal. Furthermore, the contact band considerably facilitates the initial installation of the filter ventilator in the wall. Because of the teeth on the contact band it is not necessary to remove the lacquer from the wall of the switch cabinet, as must be done in the state of the art. The contact band with teeth, which are made for example of copper beryllium, is commercially available. The teeth cut into the edge of the aperture, which has been left exposed following the nibbling or cutting, and fit closely there. The contact band thus creates an optimal electrical contact between the wall and the build-in frame.

For the ventilator motor is it provided that it is attached to the insertion frame by means of screws. This screw attachment ensures an adequately secure mounting and enables rapid and simple replacement of the motor.

It is further provided that the ventilator motor is attached to the insertion frame by means of self-tapping screws, such that the internal threads cut by the screws are disposed on the insertion frame, in particular in the grid. During the manufacture of the insertion frame or grid, therefore, no threaded bores or the like need be constructed. Nor are nuts or the like required.

As a result, the number of individual parts of the filter ventilator is kept small. This contributes to an economical manufacture of the ventilator.

In an especially preferred embodiment of the filter ventilator, it is provided that the insertion frame is made of injection-molded plastic. Plastic parts can be simply and economically constructed by injection molding and their surface can be coated with metal. By this means the electrical conductance and hence the EMC sealing can be ensured in a simple and economical manner.

It is further provided that the filter ventilator comprises a covering cap that is releasably fixed to the insertion frame, such that the filter is disposed between insertion frame and covering cap and the covering cap comprises a region through which air can flow. The cap has both technical and aesthetic functions. For the covering cap it is preferably provided that the air-permeable region comprises plurality of lamellae, which are oriented in such a way that the air sucked in between them flows in the upward direction. As a result, the number of dust particles that are sucked in is minimized and splashed water is largely prevented from penetrating into the interior of the ventilator.

For an alternative embodiment of the ventilator in accordance with the invention it can be provided that the build-in frame is dished, such that the wall of the dish encloses the ventilator motor and there is at least one region through which air can pass. The dish shape of the build-in frame eliminates the possibility that the ventilator motor might fall down into the interior of the switch cabinet during the installation work. If the build-in frame is made of metal or at least has a metallic surface, the EMC sealing of the ventilator is additionally increased thereby. Furthermore, shielding between the ventilator motor and the interior of the switch cabinet is thus achieved. Preferably the air-permeable region of the dish region is formed by an additional grid. A grid on one hand allows a high throughput of air, and on the other hand produces tight EMC sealing.

For the exhaust filter in accordance with the invention it is provided that the exhaust filter is constructed like the filter ventilator described above except that it does not comprise a ventilator motor with fan blades. By simply eliminating the ventilator motor, an exhaust filter can be produced instead of a filter ventilator. From the standpoint of manufacturing technology, this is an especially simple and economical solution. The exhaust filter requires no additional parts.

For another embodiment of the filter ventilator in accordance with the invention it can be provided that instead of a single ventilator motor, the ventilator comprises several motors disposed side by side. Preferably these are arranged as a matrix and are constructed as axial ventilators. This embodiment has the advantage that the ventilator can be of very flat construction. Furthermore, the filter ventilator remains functional even if one motor should stop working.

Other characteristics, advantages and special embodiments of the invention are the subject matter of the subordinate claims.

In the following the invention is explained in detail with reference to the attached drawings, wherein

| | |
|---|---|
| FIG. 1 | shows an exploded view, in perspective, of a first preferred embodiment of a filter ventilator in accordance with the invention; |
| FIG. 1a | shows part of a perspective view of a build-in frame of the filter ventilator according to FIG. 1; |
| FIG. 1b | shows part of a perspective view of an insertion frame of the filter ventilator according to FIG. 1; |
| FIG. 2 | shows a longitudinal section through the filter ventilator according to FIG. 1; |
| FIG. 3 | shows a longitudinal section through the assembled filter ventilator according to FIG. 2; |

| | -continued |
|---|---|
| FIG. 4 | shows a longitudinal section through a second embodiment of the filter ventilator according to the invention in the assembled state; |
| FIG. 5 | shows a longitudinal section through a third embodiment of the filter ventilator according to the invention; |
| FIG. 6 | shows a longitudinal section through a fourth embodiment of the filter ventilator according to the invention; |
| FIG. 7 | shows a longitudinal section through the assembled filter ventilator according to FIG. 6; and |
| FIG. 8 | shows a cross-sectional view along the line A-A in FIG. 6. |

Figures 1, 1A, 1B:
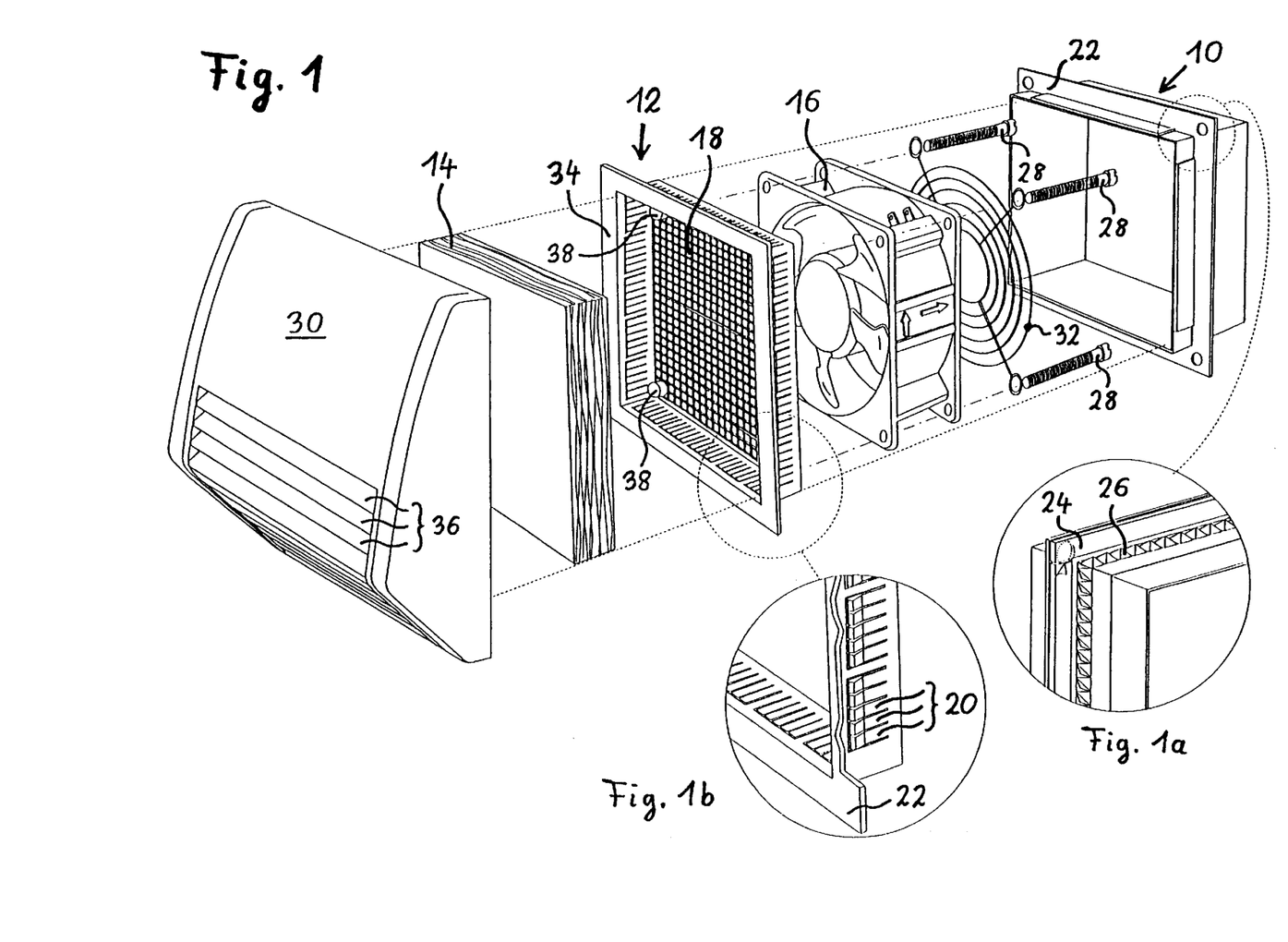

FIG. 1 shows in perspective an exploded view of a first preferred embodiment of the filter ventilator in accordance with the invention. The ventilator is provided for installation within an aperture in a wall that is not shown. The ventilator comprises a build-in frame 10, an insertion frame 12, a filter 14, a ventilator motor 16 and a covering cap 30.

The build-in frame 10 is constructed as a rectangular frame with a flange 22 extending outward at its periphery. To one side of the flange 22 adhesive strips 24 are attached.

Immediately next to the adhesive strips 24 the build-in frame 10 is surrounded by a contact band 26, which runs around its periphery. The contact band 26 comprises teeth that extend outward. FIG. 1a shows a corner of the frame enlarged to make clear the arrangement of the adhesive strip 24 and contact band 26.

The ventilator motor 16 comprises fan blades so constructed as to generate an airstream parallel to the axis of rotation of the motor. Associated with the motor 16 is a plurality of screws 28 with which to attach the motor to the insertion frame 12. A protective grille 32 is also associated with the motor 16. A ventilator motor 16 of this kind is commercially available.

The insertion frame 12 comprises at one end face a flange 34 and at the other end face a grid 18. The flange 34 extends outward from the insertion frame 12 all around its periphery. The grid 18 extends within the entire insertion frame 12, parallel to the plane of the frame. The insertion frame 12 further comprises along its peripheral surface a large number of flexible tongues 20, which extend perpendicular to the plane of the frame. By way of the tongues 20 the insertion frame 10 is set into the build-in frame 12 so as to leave hardly any gaps. On its side that faces the filter 14 the grid 18 comprises spacer elements 38. On its side that faces the ventilator motor 16 the grid 18 also comprises spacer elements, which are not visible in this drawing. The insertion frame 12 is constructed in one piece.

FIG. 1b shows an enlarged part of the insertion frame to make clear the arrangement of the tongues 20.

The filter 14 has a square shape and its cross section is slightly smaller than the internal cross section of the insertion frame 12. Hence the filter 14 can be inserted into the insertion frame 12.

The covering cap 30 can be stuck together with the insertion frame 12, so that the filter 14 can be clamped between the cap 30 and the insertion frame 12. The covering cap 30 is provided to be brought into contact with the outer surface of the wall (not shown). The cap 30 is the only part of the filter ventilator that is visible from outside the wall. The cap 30 includes a region comprising a plurality of lamellae 36, between which air can pass. The lamellae 36 are disposed parallel to one another and are so oriented that the airstream is sucked through at a predetermined range of angles with respect to the axis of rotation of the ventilator motor 16. It is provided that the cap 30 can be so disposed that the airstream passes through the air-permeable region thereof in an upward movement. In this case the lamellae 36 are oriented in such a way that splashed water is hardly able to penetrate into the filter ventilator.

Figure 2:
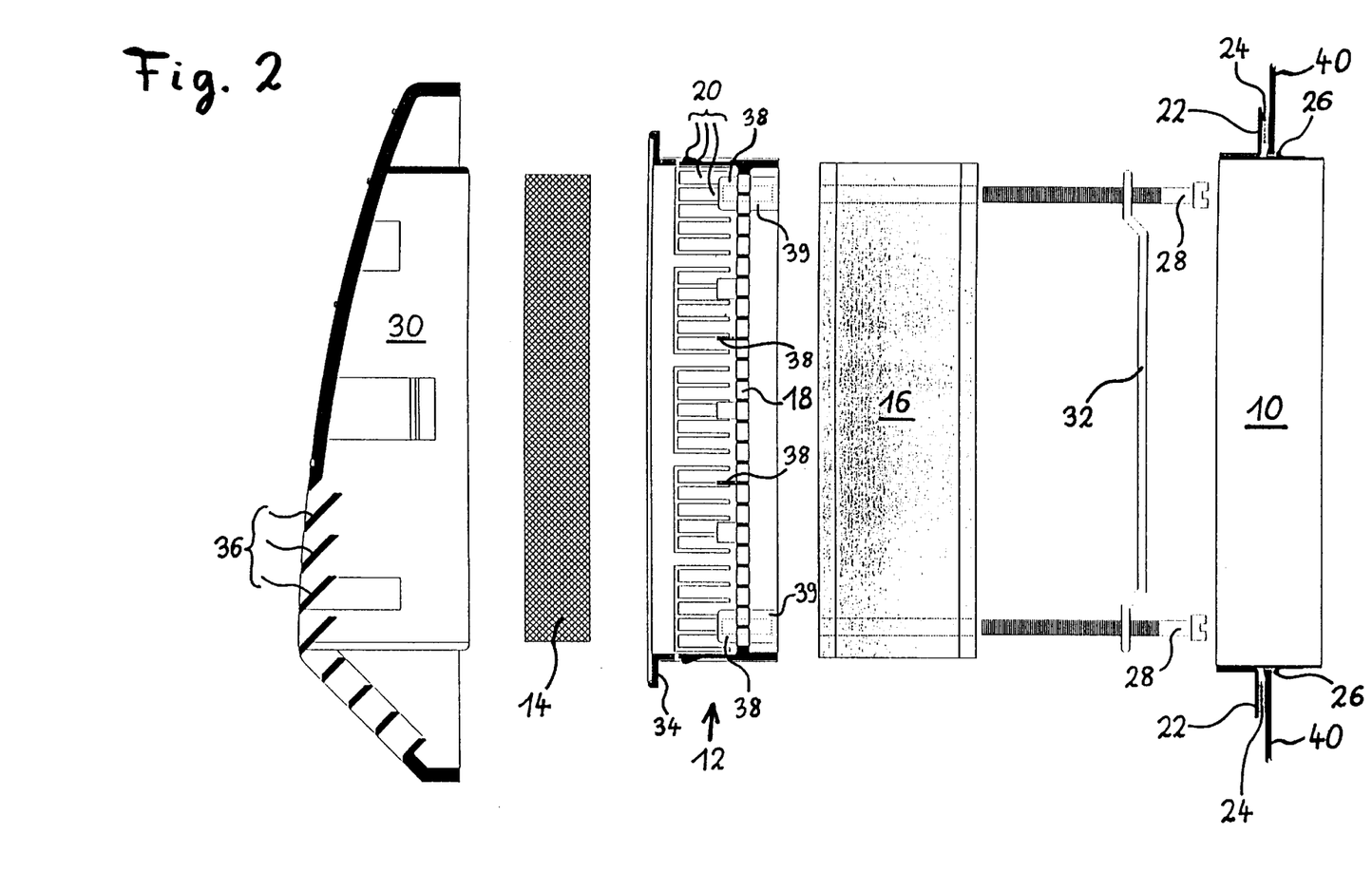

FIG. 2 shows a longitudinal section through the filter ventilator in accordance with FIG. 1. In FIG. 2 the way the build-in frame 10 is seated in an aperture in a wall 40 is illustrated. The build-in frame 10 is attached to the outside of the wall 40 in the region surrounding the edge of the aperture. The means of attachment is provided by the adhesive strips 24 that have been fixed to the flange 22 of the build-in frame 10.

FIG. 2 further makes clear how the ventilator motor 16 and the insertion frame 12 can be assembled. Together with the protective grille 32, the motor 16 can be mounted on the insertion frame 12, by means of screws 28 that are screwed into the spacer elements 39. The screws 28 comprise a self-tapping thread. The insertion grid 12 is made of either metal or injection-molded plastic. In the latter case the insertion grid 12, made of injection-molded plastic, is coated with a layer of metal so that the insertion grid 12 is electrically conducting and the desired EMC sealing is achieved.

The cover cap 30 and the insertion grid 12 can be put together in such a way that the filter 14 fits into the cavity formed between the cover cap 30 and insertion grid 12. Hence no additional means of attachment are needed for the filter 14.

Figure 3:
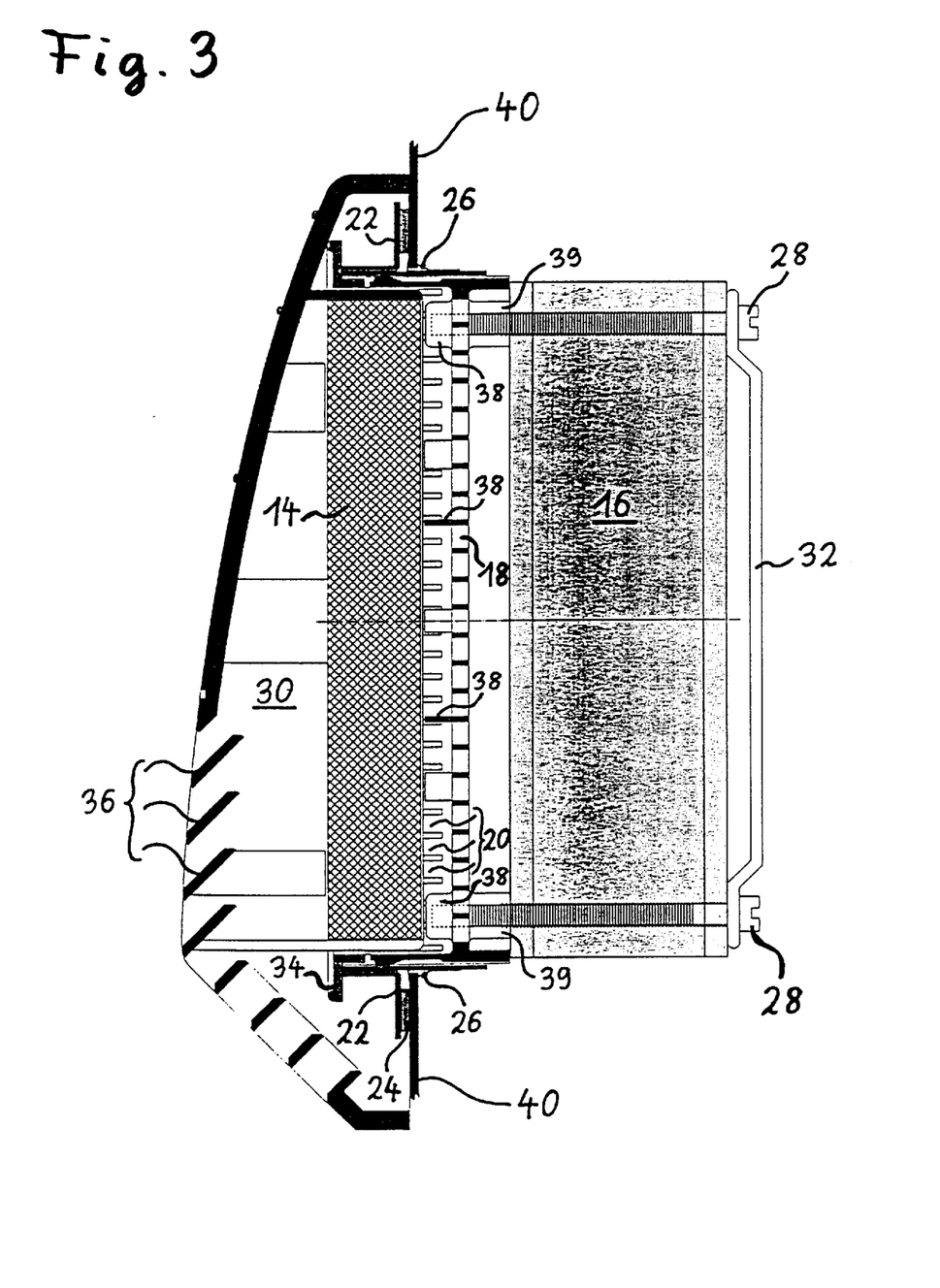

FIG. 3 shows the filter ventilator according to FIG. 2 in the assembled and installed state, so that the actual installed positions of the filter and other ventilator components are illustrated. FIG. 3 makes clear that there is a continuous electrical connection, involving very short distances, from the wall 40 through the teeth of the contact band 26, the build-in frame 10 and the insertion frame 12 to the grid 18. A tight EMC sealing is thus guaranteed. The spacer elements 38 ensure that there is an empty space between the grid 18 and the filter 14, which serves as pressure-equilibration or turbulence space. The airstream pressure loss is kept small by this space. The same applies to the empty space formed between grid 14 and ventilator motor 16. Furthermore, FIG. 3 illustrates the extremely compact construction of the filter ventilator as a whole.

Figure 4:
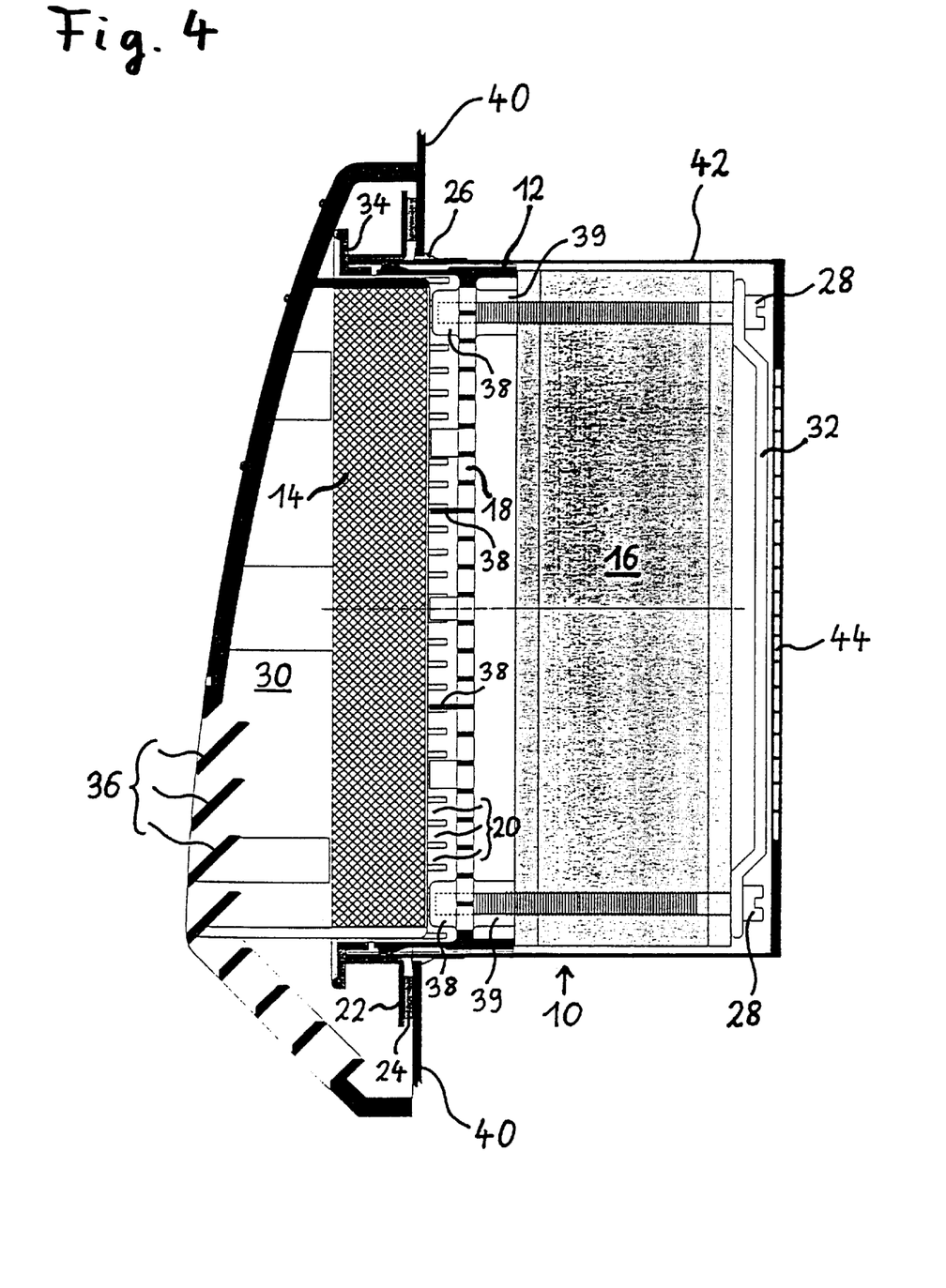

In a second embodiment of the filter ventilator in accordance with the invention it is provided that the build-in frame 12 has a dished construction. This is illustrated by the longitudinal section shown in FIG. 4. The alternative embodiment shown in FIG. 4 differs from the embodiment according to FIG. 3 merely in that a dish region 42 of the dished build-in frame 10 encloses the ventilator motor 16. The dish region 42, on the side opposite the covering cap 30, comprises an air-permeable region 44, which is preferably likewise constructed as a grid. When the build-in frame 10 including the dish region 42 is made of metal, or at least provided with a metallic surface coating, an additional EMC shielding is thereby achieved. In this embodiment the EMC shielding between the ventilator motor 16 and the interior of the switch cabinet is reinforced. This can be required or desirable for certain applications. In any case, this measure increases the overall tightness of the EMC sealing of the filter ventilator. In this embodiment the protective grille 32 is not absolutely necessary.

Furthermore, an exhaust filter can be made available by simple means. The exhaust filter contains all the components of the filter ventilator except for the ventilator motor 16, the protective grille 32 and the screws 28. No additional components are needed. This concept is especially favorable from the standpoint of manufacturing technology, because all the parts of the exhaust filter are also parts of the filter ventilator. The exhaust filter incorporates all the components that increase the tightness of the EMC seal in the filter ventilator. The fact that both the ventilator and the exhaust filter are covered by the same cap 30 is particularly advantageous with respect to the aesthetic design of the switch cabinet. The exhaust filter can be retrofitted with a ventilator motor 16 in a simple manner, after which it can be used as a filter ventilator.

Both the filter ventilator and the exhaust filter in accordance with the invention can be equipped with a funnel-shaped covering cap. In this case the filter 14 is disposed in the broader region of the cap, on the side of the wall opposite the ventilator motor 16. This arrangement allows a larger filter to be used, which can take up more dust particles and hence remains functional for a longer period of time.

Figure 5:
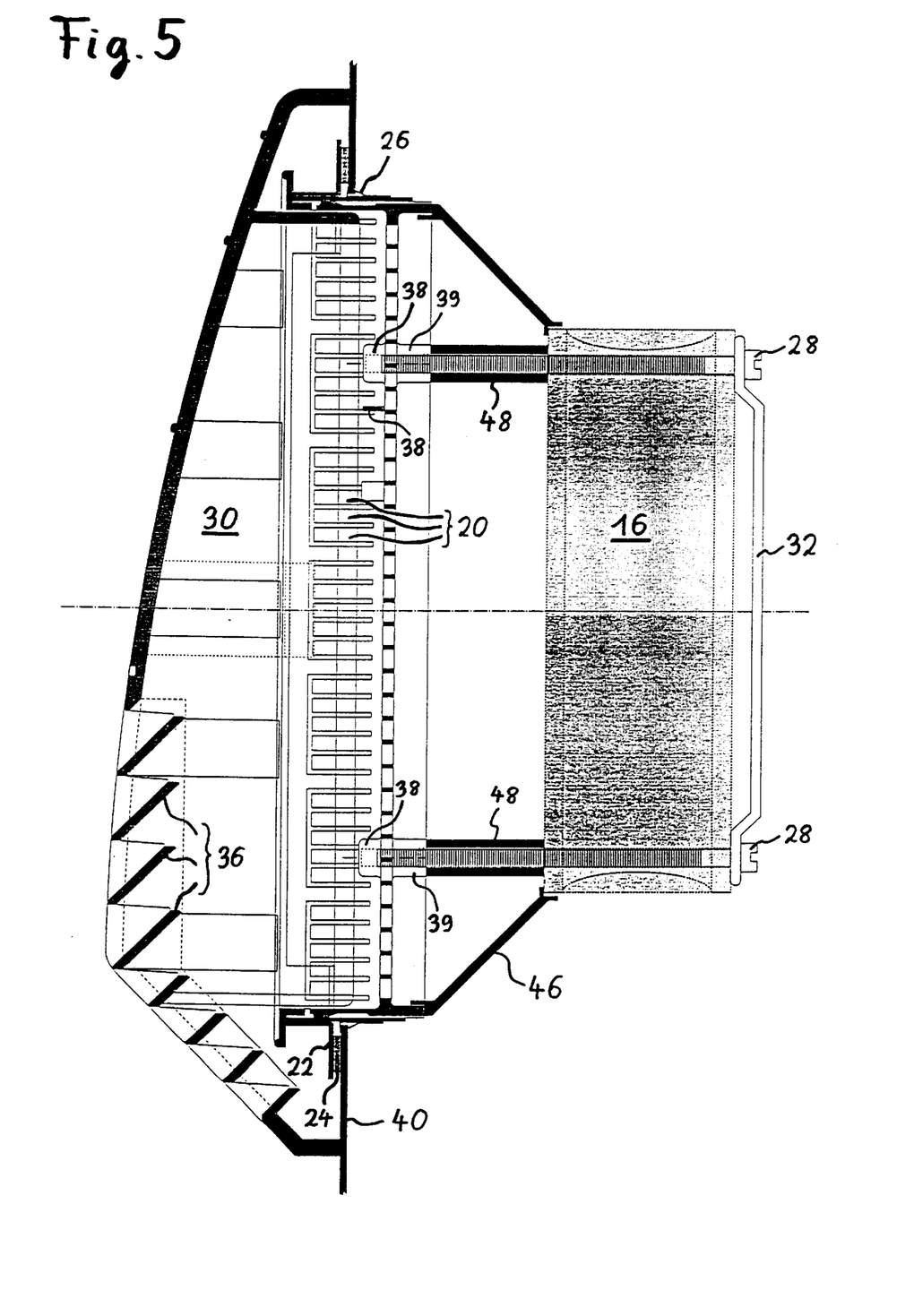

In FIG. 5 a third embodiment of the filter ventilator in accordance with the invention is shown, in which the insertion frame 12 is funnel-shaped. In other respects this embodiment is constructed like that according to FIG. 3, in which the identical components are identified by the same reference numerals. The embodiment according to FIG. 5 comprises an adapter 46, positioned between the insertion frame 12 and the ventilator motor 16. The adapter 46 is funnel-shaped, with its larger opening matched to the dimensions of the insertion frame 12 and its smaller opening, to those of the ventilator motor 16. The adapter 46 is made of injection-molded plastic and is metallized. The two openings of the adapter 46 each comprise projections distributed around the periphery of the openings, so that the adapter 46 can be put together with the insertion frame 12 and the ventilator motor 16 so as to ensure a good fit in each case. In addition, a spacer tube 48 is provided for each screw 28. The length of the spacer tubes 48 corresponds to the depth of the adapter 46. Each of the spacer tubes 48 is clamped between a spacer element 39 and the ventilator motor 16, by the screw 28 that passes through that particular spacer tube 48. The insertion frame 12, the adapter 46 and the ventilator motor 16 can thus likewise be assembled with tight EMC sealing. This embodiment also makes it possible to use a filter with a cross-sectional area substantially larger than that of the ventilator motor 16. In this case the build-in frame 10, the insertion frame 12, the covering cap 30 and the opening in the wall 40 are all made correspondingly larger than the ventilator motor 16. The filter used in this case can take up more dust particles and remains functional for a longer time.

Finally, both the filter ventilator and the exhaust filter can be constructed as a version that is not tightly EMC-sealed. In this case the toothed contact band 26 is not required. An insertion frame 12 made of injection-molded plastic that is not metallized is sufficient. In this way especially economical filter ventilators and exhaust filters can be produced, in case EMC sealing is not required.

In addition, it is possible for the grid 18 to be attached directly to the build-in frame 10. The insertion frame 12 is not provided in this alternative construction. Instead of the adhesive strips 26, in this case releasable attachment means are provided for the build-in frame 10. This is an especially economical alternative with relatively uncomplicated structure.

Figure 6:
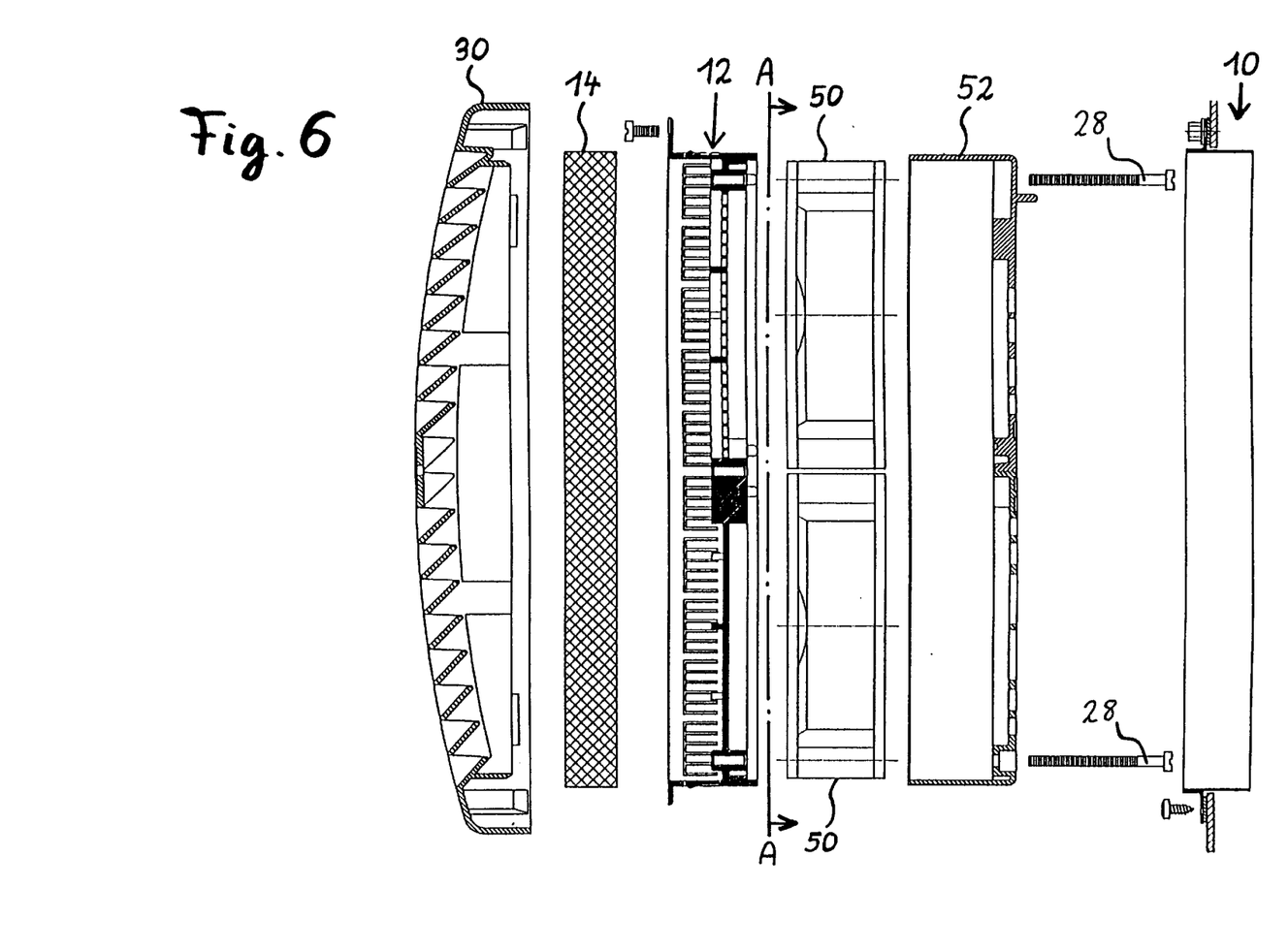

FIG. 6 shows a fourth embodiment of the filter ventilator in accordance with the invention. As in the preferred embodiment, the fourth embodiment comprises the build-in frame 10, the insertion frame 12, the filter 14 and the covering cap 30. The build-in frame 10 and the insertion frame 12 are constructed just as in the embodiment according to FIG. 2. The fourth embodiment according to FIG. 6 is distinct in that instead of a single ventilator motor, it comprises four ventilator motors 50 arranged in a matrix. Each of the motors (50) comprises fan blades. Instead of the protective grille 32, this embodiment has a dished retaining grille 52, which serves both as a protective grille and as a receptacle for the ventilator motors 50. The retaining grille 52 is dimensioned such that a plurality of ventilator motors 50 can be set into it in a substantially form-fitting manner. Like the protective grille 32, the retaining grille 52 can be attached to the insertion frame 12 by means of screws 28. In this case each of the four screws 28 passes through one of the four ventilator motors 50.

The use of several ventilator motors 50 enables this filter ventilator to be made especially flat. Furthermore, this ventilator can be constructed with a relatively large cross-sectional area. As a consequence, correspondingly large filters 14 can be used, which can take up a relatively large amount of dust. The frequency with which the filters must be exchanged is thereby reduced. Another advantage of this embodiment is that in the case of failure of one ventilator motor 50, the ventilator nevertheless remains functional.

The embodiment with several ventilator motors 50 is not restricted to four motors 50 in a square array. A larger number of motors is also possible. For example, filter ventilators with 2×3, 3×3, 2×4 etc. ventilator motors 50 are conceivable, when this is advantageous for the particular application. A filter ventilator can be constructed in an especially flat shape, for instance, by using several ventilator motors in a large wall aperture.

Figure 7:
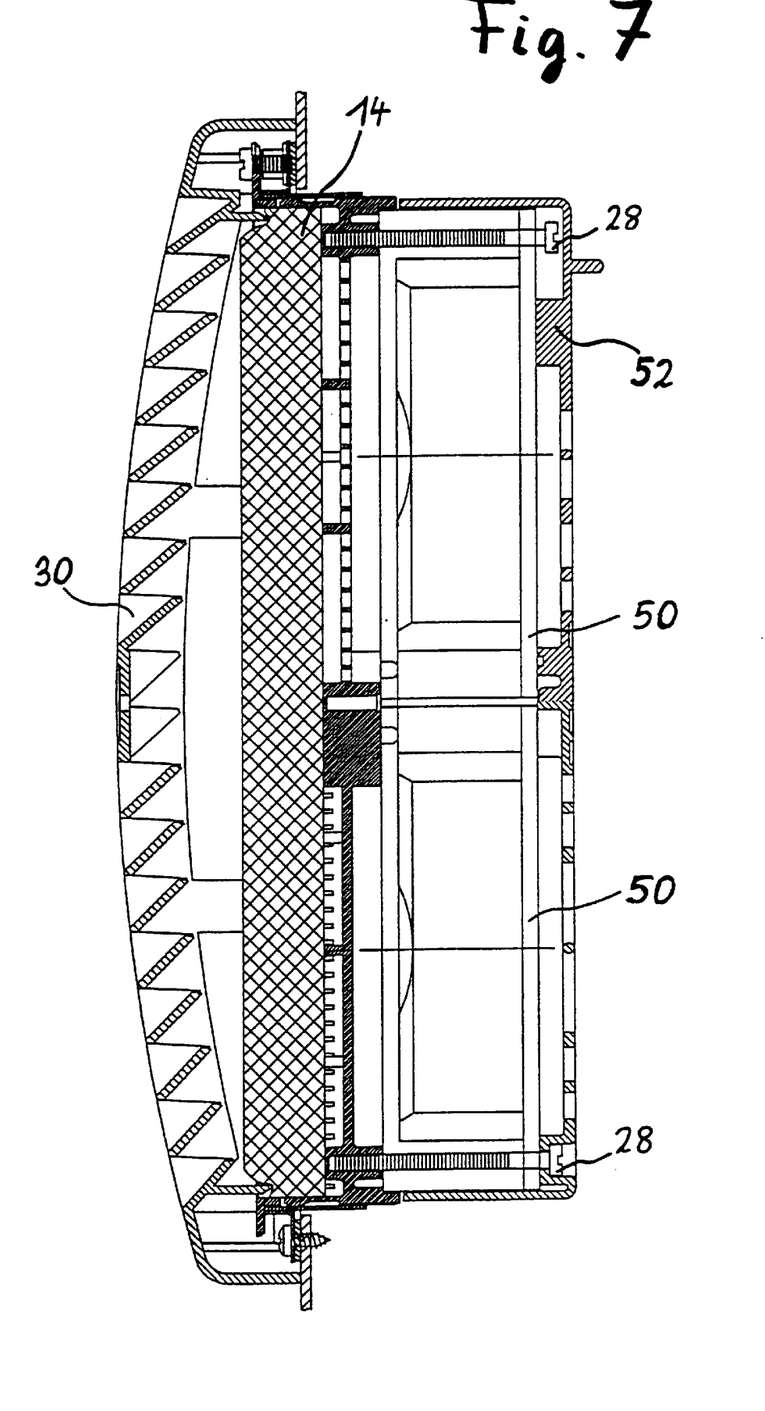
Figure 8:
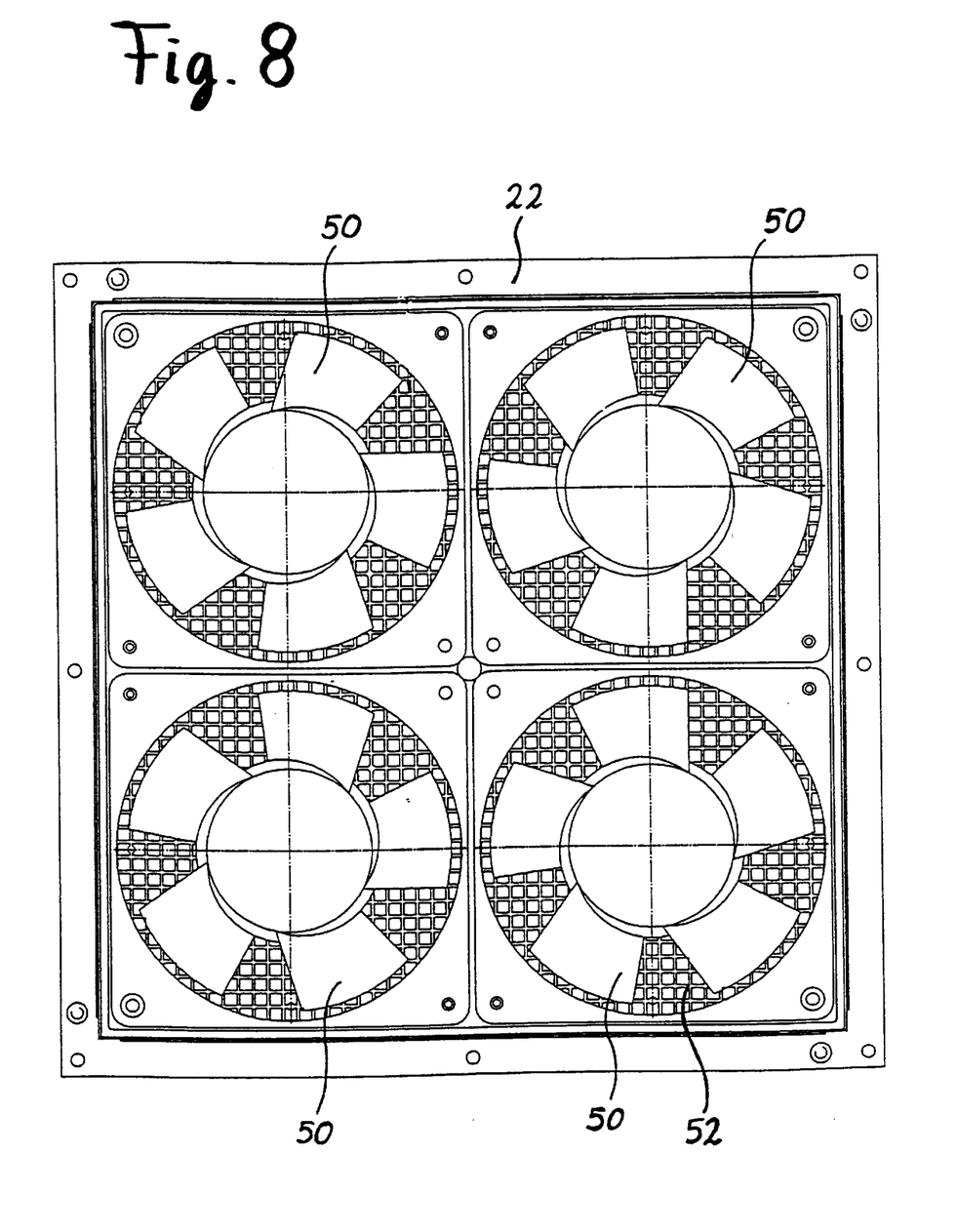

The filter ventilator according to FIG. 6 is shown in assembled form in FIG. 7. A cross-sectional view is shown in FIG. 8, in order to make clear the arrangement of the ventilator motors 50 within the retaining grille 52 and the build-in frame 10.

List of Reference Numerals

| | |
|---|---|
| 10 | Build-in frame |
| 12 | Insertion frame |
| 14 | Filter |
| 16 | Ventilator motor |
| 18 | Grid |
| 20 | Flexible tongues |
| 22 | Flange |
| 24 | Adhesive strips |
| 26 | Contact band |
| 28 | Screws |
| 30 | Covering cap |
| 32 | Protective grille |
| 34 | Flange |
| 36 | Lamellae |
| 38 | Spacer element |
| 39 | Spacer element |
| 40 | Wall |
| 42 | Dish region |
| 44 | Grid |
| 46 | Adapter |
| 48 | Spacer tube |
| 50 | Ventilator motors |
| 52 | Retaining grille |

What is claimed is:
1. A filter ventilator for installation within an aperture in a wall comprising:
a ventilator motor with fan blades;
a filter positioned ahead of the ventilator motor in terms of airflow through the ventilator;
a build-in frame provided with attachment means whereby the frame can be permanently fixed within the aperture; and an insertion frame which is removably inserted into the build-in frame, and to which the ventilator motor is releasably connected and in which the filter is removably set.

2. A filter ventilator according to claim 1, wherein the insertion frame comprises a grid extending parallel to the plane of the frame and disposed between the ventilator motor and the filter.

3. A filter ventilator according to claim 2, wherein the insertion frame is integrally formed with the grid.

4. A filter ventilator according to claim 2, wherein the insertion frame comprises first spacer elements to maintain a predetermined distance between the grid and the filter.

5. A filter ventilator according to claim 2, wherein the insertion frame comprises second spaced elements to maintain a predetermined distance between the grid and the ventilator motor.

6. A filter ventilator according to claim 2, wherein the build-in frame, the insertion frame and the grid are either made of metal or at least their surfaces are covered by a metal coating.

7. A filter ventilator according to claim 1, wherein the insertion frame is releasably fixed within the build-in frame by a clamping means.

8. A filter ventilator according to claim 7, wherein the clamping means comprises a plurality of flexible tongues.

9. A filter ventilator according to claim 8, wherein the flexible tongues are disposed around the periphery of the insertion frame and extend perpendicular to a plane defined by the frame.

10. A filter ventilator according to claim 1, wherein the build-in frame comprises a flange on which the attachment means are mounted.

11. A filter ventilator according to claim 10, wherein the attachments means are adhesive strips.

12. A filter ventilator according to claim 1, wherein the build-in frame comprises a contact band provided with teeth, which band extends around a periphery of the build-in frame in order that the teeth can be brought into engagement with an edge of the aperture.

13. A filter ventilator according to claim 1, wherein the ventilator motor is attached to the insertion frame by screw means.

14. A filter ventilator according to claim 13, wherein the ventilator motor is attached to the insertion frame by self-tapping screws of which female threads cut by the screws are formed in the insertion frame.

15. A filter ventilator according to claim 1, wherein the insertion frame is made of injection-molded plastic.

16. A filter ventilator according to claim 1, wherein a covering cap comprising a region that is permeable to air is releasably attached to the insertion frame, the filter being disposed between the insertion frame and the covering cap.

17. A filter ventilator according to claim 16, wherein the air-permeable region of the covering cap comprises a plurality of lamellae, which are oriented in such a way that air sucked in through the air-permeable region flows in an upward direction.

18. A filter ventilator according to claim 1, wherein the build-in frame is dished and the dished region surrounds the ventilator motor and comprises at least one air-permeable region.

19. A filter ventilator according to claim 18, wherein the air-permeable region is formed by an additional grid.

20. A filter ventilator according to claim 1, wherein the ventilator motor is formed by a plurality of ventilator motors.

21. A filter ventilator according to claim 20, wherein the plurality of ventilator motors is arranged as a matrix, the airflows through the ventilator motors being parallel to one another.

22. A filter ventilator according to claim 20, wherein the filter ventilator comprises a retaining grille that acts as a receptacle for the plurality of ventilator motors.

23. A filter ventilator according to claim 1, wherein the plurality of ventilator motors comprises a plurality of axial motors.

24. An exhaust filter for installation within an aperture in a wall which is constructed as the filter ventilator according to claim 1 but without the ventilator motor and releasable connection means associated therewith.

\* \* \* \* \*